United States Patent [19]

Hall et al.

[11] 4,181,751
[45] Jan. 1, 1980

[54] PROCESS FOR THE PREPARATION OF LOW TEMPERATURE SILICON NITRIDE FILMS BY PHOTOCHEMICAL VAPOR DEPOSITION

[75] Inventors: Thomas C. Hall, Irvine; John W. Peters, Malibu, both of Calif.

[73] Assignee: Hughes Aircraft Company, Culver City, Calif.

[21] Appl. No.: 910,704

[22] Filed: May 24, 1978

[51] Int. Cl.² .................. C01B 21/06; B05D 3/06
[52] U.S. Cl. .................. 427/53.1; 427/54.1; 427/94; 427/248 B; 423/344; 423/406
[58] Field of Search .............. 427/94, 248 B, 53, 54; 423/344, 406

[56] References Cited
U.S. PATENT DOCUMENTS

| | | | |
|---|---|---|---|
| 3,503,798 | 3/1970 | Yoshioka | 427/94 |
| 4,091,407 | 5/1978 | Williams et al. | 427/94 |

OTHER PUBLICATIONS

Collet, M. G., *J. Electrochemical Soc.* "Low Temp . . . Reaction", vol. 116, Pp. 110–111 (1969).
Van der Breckel et al., *J. Electrochemical Soc.*, "Control of Deposition . . . by 2537 Å Radiation," vol. 119, P372–376 (1972).

*Primary Examiner*—Michael F. Esposito
*Attorney, Agent, or Firm*—Booker T. Hogan, Jr.; W. H. MacAllister

[57] ABSTRACT

Low temperature photonitride (LTPN) films of excellent quality have been prepared at temperatures ranging from 300° C. downward to 100° C. by a photochemical vapor deposition process, wherein a mixture of silane, ammonia, and hydrazine is caused to react to form $Si_3N_4$ films at the substrate interface. These films are suitable for the preparation of silicon nitride passivation layers on solid-state devices, such as metal-oxide semiconductors (MOS) and charge coupled devices to impart enhanced reliability.

7 Claims, 1 Drawing Figure

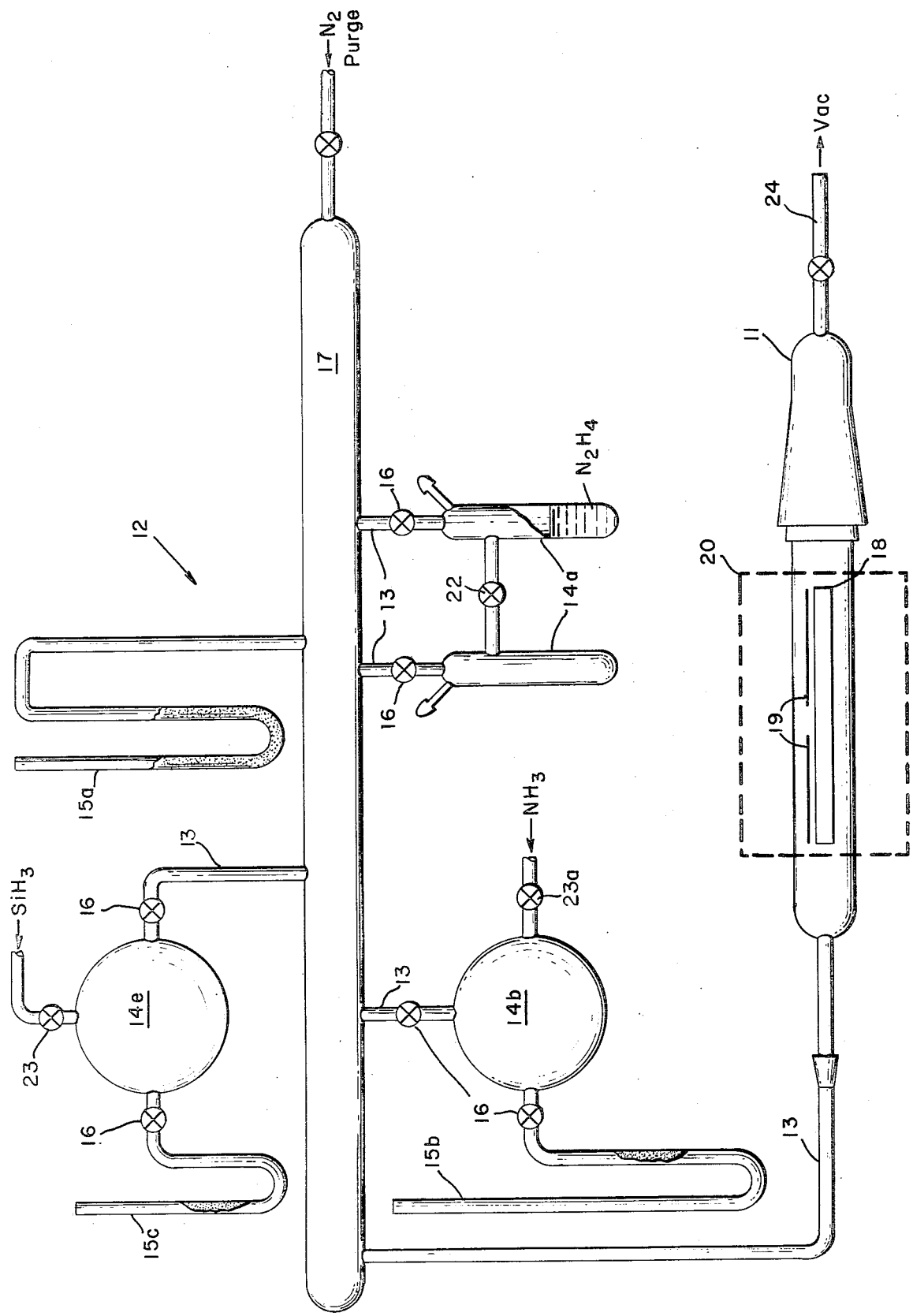

PROCESS FOR THE PREPARATION OF LOW TEMPERATURE SILICON NITRIDE FILMS BY PHOTOCHEMICAL VAPOR DEPOSITION

The Government has rights in this invention pursuant to Contract No. F33615-76-C-5081 awarded by the Department of the Air Force.

BACKGROUND OF THE INVENTION

1. Field of the Invention

This invention relates to the preparation of silicon nitride films in general and more particularly to the preparation of silicon nitride films by chemical vapor deposition (CVD) processes.

2. Prior Art

Silicon nitride passivation layers on solid-state devices such as MOS and charge coupled types impart enhanced reliability to the devices by preventing corrosion and device degradation due to the deleterious effect of environmental contamination from both moisture and mobile ions.

In order for a $Si_3N_4$ film to function effectively as a moisture barrier and/or a mobile ion ($Na^+$, $K^+$) barrier, it is essential that the silicon nitride passivation layer be free of oxygen. Silicon nitride films containing chemically bonded oxygen are permeable to both moisture and mobile ions, thereby defeating the purpose of a silicon nitride passivation layer on solid-state devices.

Low temperature photochemical silicon nitride (LTPN) films have been prepared by employing the mercury photosensitized gas phase reaction of either a mixture of silane ($SiH_4$) and hydrazine ($N_2H_4$) or a mixture of $SiH_4$ and ammonia ($NH_3$). The overall stoichiometry for both reactions is represented by the following equations:

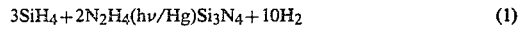
$$3SiH_4 + 2N_2H_4 (h\nu/Hg) Si_3N_4 + 10H_2 \quad (1)$$

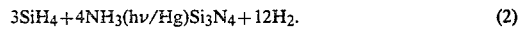
$$3SiH_4 + 4NH_3 (h\nu/Hg) Si_3N_4 + 12H_2. \quad (2)$$

This work is described in "Low Temperature Silicon Nitride Using A Photochemical Reaction", Collet, M. G., J. E. Electrochem Soc. 116, 110 (1969), and in "Control of Deposition of Silicon Nitride Layers by 2537 Å Radiation", Van den Breckel, C.H.J., and Severin, P. J., J. Electrochem Soc. 119 372 (1972). However thin films prepared in accordance with the teachings of the above references were found to be faulty due to unacceptable pinhole incidences.

It is therefore an objective of this invention to provide an improved process for preparing low temperature photonitride films suitable for use as passivation layers on solid-state devices.

Another objective of this invention is to provide a process for preparing low temperature photonitride films of high quality and free of chemically bonded oxygen.

A further objective of this invention is to provide a process for preparing high quality low temperature photonitride films at practical deposition rates.

SUMMARY OF THE INVENTION

In achieving the above stated objectives and at the same time avoiding most, if not all, of the disadvantages of known prior art processes, we have developed a process for the deposition of low temperature silicon nitride films which employs a silane gettering technique which removes oxygen and moisture from the nitrogen containing reactants in conjunction with a mercury vapor photosensitized reaction of a predetermined vapor mixture of silane ($SiH_4$), ammonia ($NH_3$) and hydrazine ($N_2H_4$) at temperatures from 300° C. downward to 100° C.

Mercury vapors are added to the mixture of reactants, until the mixture is saturated with mercury vapors, to increase the sensitivity of reactants in the mixture to the absorption of photons at a desired wavelength.

Next, the sensitized mixture is exposed to photonic energies in sufficient amounts to excite the molecules therein to a reactive state thereby inducing a photochemical reaction which yields $Si_3N_4$ films at the interface of selected substrates which have been heated to chosen elevated temperatures. The $Si_3N_4$ films deposited onto the substrates are substantially free of pinholes and impervious to moisture and mobil ions.

BRIEF DESCRIPTION OF THE DRAWING

The FIGURE is a schematic drawing of a photochemical reactor and gas handling apparatus suitable for carrying out the invention described below.

DETAILED DESCRIPTION OF THE INVENTION

In seeking to fabricate solid state devices exhibiting enhanced reliability, it is desirable to provide passivation layers that are essentially impermeable with respect to moisture and mobile ions. In seeking to achieve the afore-stated objectives, we discovered that the presence of oxygen containing contaminants in either $NH_3$ or $N_2H_4$ led to the production of poor quality passivation layers when either of these materials are reacted with $SiH_4$ to produce $Si_3N_4$ films.

We then discovered that all oxygen containing contaminants could be removed from $NH_3$ and from $N_2H_4$ by treating these materials with $SiH_4$ after they have been purified by conventional means.

As a result of these discoveries, we then found that it is possible to produce $Si_3N_4$ films via reactions which proceed in accordance with Equations 1 and 2, as shown above, which exhibit improved characteristics when compared to prior art processes for producing said films.

The reaction of preconditioned $N_2H_4$ and $SiH_4$ proceeded at a very fast deposition rate but produced very little improvement in film quality when compared to the results of prior art processes.

Films produced upon reacting preconditioned $NH_3$ with $SiH_4$ were of excellent quality. However, the deposition rate of this process was unacceptably low.

In an attempt to combine the advantages of each of these reactions, mixtures of preconditioned $NH_3$ and $N_2H_4$ were utilized. These mixtures are combined with $SiH_4$ and saturated with mercury vapor to increase their sensitivity. The saturated mixture of reactants is then irradiated with photonic energy in the presence of preconditioned heated substrates. The energy induces a reaction which yeilds $Si_3N_4$ which deposits onto the substrate at practical deposition rates to form an impervious film of $Si_3N_4$ substantially free of pinholes.

This process may be carried out in an apparatus whose characteristics are substantially equivalent to that shown by the schematic presented in FIG. 1. Here, a quartz reaction chamber 11 is connected to a pyrex gas handling system 12 comprised of gas transmission lines 13, expansion storage vessels 14 of known volumes, vacuum manometers 15, isolation stopcocks 16, and a mixing manifold 17. A means 18 such as an aluminum platen for heating target substrates 19 is provided within the reaction chamber 11. Disposed about the periphery of the reaction chamber is a means for providing photonic energy at 2537 Å 20.

As shown in the FIGURE, $N_2H_4$ is stored in vessel 14a and isolated from the mixing manifold 17 by stopcocks 16. Stopcock 22 is an intervessel isolation stopcock which facilitates closer monitoring, by vacuum manometer 15a, of the vapor pressure when this storage system is opened into the manifold.

Ammonia is admitted to the system through the entrance of valve 23 and stored in vessel 14b. A vacuum manometer 15b is employed to monitor the amount of $NH_3$ admitted to the manifold 17.

Silane is admitted to the system through the entrance valve 23a and stored in vessel 14c. Vacuum manometer 15b is employed to monitor the amount of $SiH_3$ removed from the storage vessel and admitted to the manifold.

The mixing manifold 17 and gas reactor 11 is evacuated after purging to remove contaminates has been completed. Reactant gases contained in the storage vessels 14a, 14b and 14c are admitted to the manifold 17 and allowed to flow into the reaction chamber 11.

The reactants absorb ultraviolet (UV) radiation at wavelengths below 2200 Å in the case of $NH_3$ and $SiH_4$, and 2400 Å in the case of $N_2H_4$. Only radiation which is absorbed, either by the reactants or the photosensitizer, can lead to a photochemical reaction. The most convenient source of UV light for photochemical processes is the quartz mercury arc lamp. However, it is limited by the quartz cutoff of approximately 2000 Å leaving only a very narrow "window" between 2000 and 2200 A for $NH_3$ or 2400 Å for $N_2H_4$ for light activation.

The limitation may be overcome by resorting to photosensitization techniques such as that taught by J. P. Elgin and H. S. Taylor, J. Am. Chem. Soc., 51, page 2059 (1929); and H. J. Emeleus et al, Trans. Faraday Soc., 32, page 1577 (1936).

We have found that a convenient means of photosensitizing a gas phase chemical reaction is to saturate the system with mercury vapor at room temperature ($10^{-3}$ torr) and to irradiate the system with mercury resonance radiation. A strong resonance line in the mercury spectrum occurs at 2537 Å. Nearly all of that radiation is absorbed by the mercury vapor contained within the reactive chemical system. Mercury sensitizer is supplied to the system by the vapor above the mercury in the manometer 15a.

In practice, the photonic energy is absorbed by the mercury vapor, raising it from a singlet ground state ($S_o^{\frac{1}{2}}$) to a triplet excited state ($P^{3/2}$) as follows:

$$h\nu(2537 \text{ Å}) + Hg(S_o^{\frac{1}{2}}) \rightarrow Hg(P^{3/2}) \quad (3)$$

or more simply:
$$h\nu(2537 \text{ Å}) + Hg^o \rightarrow Hg^* \quad (4)$$

where
- $Hg^o$ = Ground state mercury atom
- $Hg^*$ = Excited state mercury atom
- h = Planck's constant
- $\nu$ = Radiation frequency The excited Hg* atom then conveys its energy by collision to the chemical reactants within the system, generating free radicals which initiate chain reactions eventually leading to the final $Si_3N_4$ product. These processes are illustrated below.

$$Hg^* + SiH_4 \rightarrow H + Hg^o + SiH_3 \quad (5)$$

and
$$Hg^* + N_2H_4 \rightarrow 2NH_2 + Hg^o \quad (6)$$

These species, by interaction with other unexcited reactants, lead to the desired final product, silicon nitride in accordance with the following equation:

$$3SiH_4 + 2NH_3 + N_2H_4 \rightarrow Si_3N_4 + 5H_2 \quad (7)$$

The efficiency with which the photonic energy is conveyed to the chemical system is thus greatly enhanced by photosensitization.

The photochemical deposition process described above must be preceeded by the careful preparation of target substrates and preconditioning of the reactants. Wafers containing silicon, silicon oxide, or aluminum over silicon-surfaces are used for photosensitized silicon nitride deposition. A preferable procedure for preparing target substrates is shown in the following example.

EXAMPLE 1

Substrate Preparation Method

Silicon wafers, 2 inches in diameter, with 8700 Å of thermally grown oxide, were coated with Hunt's negative photoresist, and a strip 2 inches long by ⅛ inch wide was exposed and developed across the center of the wafer. After baking the wafer, the oxide was etched down to the bare Si using a buffered HF solution, resulting in a strip of bare Si ⅛ inch wide across the center of the wafer. The wafers were then subjected to one of the following cleaning sequences:

Acid Cleaning
1. Load Si wafers into a glass or fluoroware holder.
2. Insert wafers into 70 percent sulfuric acid at 90° C. for 10 minutes.
3. Transfer from sulfuric acid to 70 percent nitric acid at 60° C. for 10 minutes.
4. Rinse in running 18 megohm deionized water for 10 minutes.
5. Insert wafer in 10:1 hydrofluoric acid for 30 minutes.
6. Rinse in running deionized water for 30 minutes.
7. Blow dry with filtered dry nitrogen.
8. Store in desiccator.

Solvent Cleaning
1. Load Si wafers in a glass or fluoroware holder.
2. Suspend wafer in a 1,1,1-trichlorethane vapor degreaser for 10 minutes.
3. Transfer wafer into an isopropyl alcohol vapor degreaser for 10 minutes.
4. Blow dry with filtered dry nitrogen and place in clean, covered glass Petri dish.

After the wafers were cleaned, the bare Si area and part of the oxide covered by a strip of Al 1¼ inches wide and were placed in a vacuum system for evaporation of 10,000 Å of aluminum. The resulting wafer then contained a bare Si strip, 2 bare oxide strips and 2 aluminum strips. The wafers were then placed on a small covered heater plate contained within a vacuum system in which the pressure was reduced to $10^{-6}$ torr. The wafers were then baked at 525° C. for 5 minutes. This heat treatment is similar to that employed in silicon device wafer processing and serves to "sinter" or bond the aluminum layer to the underlying, previously thermally generated, silicon dioxide film on the silicon wafer. The intent here is to simulate "real life" surfaces encountered in silicon device structures. The wafers are then scribed and broken into quarters, placed in clean glass petri dishes and stored in a desiccator for future use. The key to obtaining a passivated device is to avoid any traces of moisture and/or other contaminants.

In addition to preparing the substrates as taught above, it is also necessary to precondition the reactants to eliminate all traces of moisture and oxygen. Both hydrazine and ammonia must be absolutely dry. A suitable procedure for drying $N_2H_4$ is shown in Example 2. Example 3 is a procedure for removing all trace contaminants from $NH_3$.

EXAMPLE 2

Preconditioning of $N_2H_4$

Hydrazine is predried by stirring over potassium hydroxide pellets for 24 hours. The predried material is distilled in the presence of KOH at 25° C. with 5 torr and its distillate collected at dry ice temperatures. It should be redistilled at least two additional times, without KOH present, in the presence of dry $N_2$ at 25°:C./5 torr. The triply distilled hydrazine was stored under dry $N_2$ in the hydrazine reservoir 14a of the photonitride reactor. As a final purification step, the hydrazine should be stirred under a positive pressure of silane gas for 1 hour to remove the last trace of any oxygen-containing contaminants.

EXAMPLE 3

Preconditioning of $NH_3$

Electronic Grade Ammonia subjected to a "silane gettering" procedure is used for our photochemical reactions. This is achieved by forming a mixture of 10 torr of silane and 200 torr of electronic grade ammonia in the ammonia storage bulb 14b of the gas handling apparatus. This preconditioning sequence removes all oxygen containing contaminants from the $NH_3$.

EXAMPLE 4

Utilization of Preconditioned Reactants

Having completed the preconditioning steps described in Examples 1-3 above, LTPN films are then prepared by placing the treated substrates on the heating means located within the reactor and initiating a "bake-out" process by raising the temperature of the heating means 18 to approximately 300° C. under a "soft" vacuum ($\approx 10^{-2}$ torr).

An electrically heated platen constructed of an aluminum block is a suitable heating means. The "soft" vacuum may be created and maintained via a mechanical roughing pump attached to the gas outlet 24 of the reaction chamber 11.

The "bake-out" step is continued for approximately two hours and the system is then purged several times with ultra high purity dry nitrogen to remove all traces of atmospheric oxygen from the mechanical pump oil. This step is needed to eliminate the explosion hazard created by the subsequent removal of silane from the system.

After the bake-out and nitrogen purge is completed, the reactant gases are transferred from their respective storage vessels to the reaction chamber. The concentration of each reactant is monitored and carefully controlled by the system of isolation stopcocks 16 and vacuum manometers 15 in conjunction with storage vessels 14 and a mixing manifold 17 of known specific volumes.

The temperature of the heating means 19 is reduced to the desired substrate temperature and the system is allowed to become saturated with mercury vapor from manometer 15a.

Photonic energy is then applied via subjecting the quartz reactor to radiation from a low pressure mercury arc resonance lamp 20 and the gaseous mixture is converted to $Si_3N_4$ (by photolysis over a period ranging from 1 to 4 hours) which deposits onto the surface of the target substrates 19 to form an oxygen-free and moisture impervious film.

After deposition has been completed, the system is pumped down, by activation of the mechanical roughing pump, to remove any reactants and then ambient air is admitted to the system.

A specific example of the preparation of $Si_3N_4$ films from a mixture of $SiH_4$, $NH_3$ and $N_2H_4$ is shown below:

EXAMPLE 5

Silane-Ammonia-Hydrazine Deposition

A gas handling system substantially identical to that described above is charged with reactants prepared in accordance with the teachings of Examples 2 and 3 above.

Sample substrates prepared in accordance with Example 1 are placed onto a heater located within a quartz photochemical reactor, transparent to 2537 Å radiation, which has a diameter of 75 mm and a length of 300 mm. The reactor is surrounded by four circular low pressure mercury arc resonance lamps.

A bake-out sequence is initiated by raising the temperature of the heater within the reactor to $\approx 300°$ C. After approximately 2 hours of bake-out, the system is purged with ultra-dry nitrogen and the temperature of the substrates is lowered to the desired deposition temperature. A temperature range of from 100° to 300° is preferable.

To scavenge the last traces of moisture and oxygen, 20 torr of silane is admitted to the reactor for 5 minutes.

The mixture of reactants is formed by admitting 15 torr of silane, 35 torr of ammonia and 5 torr of hydrazine to the reactor.

The reaction system is saturated with mercury vapor to create a photosensitized mixture and the mixture is subject to irradiation from the mercury arc lamps for 1 to 4 hours.

$Si_3N_4$ formed from the photochemical reaction induced by the photonic energy imparted by the mercury lamps, will be deposited onto the target substrate surfaces in thin film layers.

Films prepared in accordance with this invention are completely impervious to moisture and mobile ions. They are suitable for multiple applications where thin, flexible passivation layers are needed. They are particularly suited for use in enhancing the reliability of hybrid micro circuits as well as wire-bonded integrated circuits mounted on lead frames.

Having fully disclosed our invention and presented teachings to enable others to utilize the invention, the scope of our claims may now be understood as follows:

What is claimed is:

1. A process for depositing silicon nitride ($Si_3N_4$) films comprising:

a. forming a vapor mixture of oxygen and moisture-free ammonia, silane and hydrazine in predetermined controlled amounts, b. sensitizing said mixture to change the level at which molecules therein absorb photon energy by saturating said mixture with mercury vapors, c. introducing a predetermined photon energy into said mixture and in quantity sufficient to excite molecules therein to a reactive state and produce a photochemical reaction which yields $Si_3N_4$ vapors, and d. passing said $Si_3N_4$ vapors over a chosen substrate heated to a preselected elevated temperature to deposit high quality $Si_3N_4$ films thereon which are substantially free of pinholes.

2. The process defined in claim 1 wherein said ammonia and hydrazine are separately pre-mixed with predetermined amounts of silane to produce a drying effect on said ammonia and hydrazine prior to mixing with silane from another source to form said vapor mixture.

3. The process defined in claim 2 wherein said substrate is heated to a predetermined elevated temperature less than 300° C. and said mixture is sensitized by saturating it with mercury vapors.

4. A process for preparing $Si_3N_4$ passivation layers on preconditioned substrates at temperatures below 300° F. that are free of pinhole incidences comprising the steps of:

a. providing oxygen-free and moisture-free sources of ammonia and hydrazine by preconditioning said materials with silane, b. elevating the temperature of said preconditioned substrates to a temperature of less than 300° F., c. forming a reaction mixture of vapors from said oxygen-free sources and $SiH_4$, d. saturating said mixture with mercury vapors, and e. subjecting said saturated mixture to photonic energies in the 2500–2600 Å range in the presence of said substrate whereby a photochemical reaction is initiated to yield $Si_3N_4$ growth at the substrate which ultimately deposit to form thin films which function as passivation layers.

5. The process of claim 4 wherein said reaction mixture is formed by providing 5 torr of hydrazine, 15 torr of silane and 35 torr of ammonia to a reaction chamber.

6. A process for forming a high quality silicon nitride film on the surface of a chosen substrate comprising:

a. forming a moisture-free reactant vapor mixture by combining predetermined amounts of preconditioned $NH_3$ with preconditioned $N_2H_4$ and silane;

b. changing the level at which molecules within said mixture absorb photon energy, by the use of a photosensitizer, to a predetermined valve; and c. introducing a predetermined photon energy into said mixture, in the presence of said substrate, thereby exciting molecules therein to a reactive state whereby a photochemical reaction will occur to yield $Si_3N_4$ at the substrate interface which deposits on said substrate, forming a film that is substantially pinhole free.

7. The process of claim 6 wherein said substrate is heated to a predetermined temperature less than 300° C. and said mixture is saturated with mercury vapors to change the level at which molecules therein absorb photon energy.

* * * * *